United States Patent
Ogawa et al.

(10) Patent No.: US 9,276,095 B2
(45) Date of Patent: Mar. 1, 2016

(54) SEMICONDUCTOR DEVICE

(71) Applicant: Sanken Electric Co., LTD., Niiza-shi, Saitama (JP)

(72) Inventors: Kazuko Ogawa, Niiza (JP); Satoshi Kawashiri, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/491,503

(22) Filed: Sep. 19, 2014

(65) Prior Publication Data
US 2015/0108540 A1 Apr. 23, 2015

(30) Foreign Application Priority Data

Sep. 20, 2013 (JP) ................. 2013-194834
Jan. 31, 2014 (JP) ................. 2014-017592
Jul. 18, 2014 (JP) ................. 2014-003865
Jul. 18, 2014 (JP) ................. 2014-148356
Aug. 25, 2014 (JP) ................. 2014-170137

(51) Int. Cl.
*H01L 29/739* (2006.01)
*H01L 29/423* (2006.01)
(Continued)

(52) U.S. Cl.
CPC ........ *H01L 29/7397* (2013.01); *H01L 29/4236* (2013.01)

(58) Field of Classification Search
CPC . H01L 29/739; H01L 29/423; H01L 29/7397; H01L 29/4236; H01L 29/7395; H01L 29/0696; H01L 29/1095; H01L 29/78; H01L 29/24; H01L 29/749; H01L 29/7455

USPC ......... 257/139, 133, 330, 331, 565, 370, 333, 257/563, 564, 566
See application file for complete search history.

(56) References Cited

U.S. PATENT DOCUMENTS 5,329,142 A 7/1994 Kitagawa et al.
6,781,199 B2 8/2004 Takahashi
(Continued)

FOREIGN PATENT DOCUMENTS

JP H05-243561 A 9/1993
JP H10-214968 A 8/1998
(Continued)

OTHER PUBLICATIONS

Apr. 20, 2015—(JP) Notification of Reasons for Refusal—App 2014-173752, Eng Tran.

*Primary Examiner* — Chuong A Luu
(74) *Attorney, Agent, or Firm* — Banner & Witcoff, Ltd.

(57) ABSTRACT

A semiconductor device includes: a first semiconductor region; a second semiconductor region; a third semiconductor region; a fourth semiconductor region; an insulation film, which is arranged on an inner wall of a recess that extends from an upper surface of the fourth semiconductor region and reaches the second semiconductor region with penetrating the fourth semiconductor region and the third semiconductor region; a control electrode, which is arranged on the insulation film on a side surface of the recess and faces the third semiconductor region; a first main electrode, which is electrically connected to the first semiconductor region, and a second main electrode, which is electrically connected to the fourth semiconductor region, wherein a ratio of a width of the recess to a width of the third semiconductor region contacting the second main electrode is 1 or larger.

9 Claims, 11 Drawing Sheets

(51) Int. Cl.
*H01L 29/78* (2006.01)
*H01L 29/24* (2006.01)
*H01L 29/749* (2006.01)

(56) References Cited

U.S. PATENT DOCUMENTS

| | | |
|---|---|---|
| 7,456,487 B2 | 11/2008 | Ogura et al. |
| 7,719,053 B2 | 5/2010 | Nakamura |
| 2002/0179976 A1* | 12/2002 | Takahashi ............... 257/370 |
| 2005/0263852 A1 | 12/2005 | Ogura et al. |
| 2007/0138547 A1 | 6/2007 | Nakamura |
| 2008/0308839 A1 | 12/2008 | Okada |
| 2009/0194811 A1 | 8/2009 | Pan et al. |
| 2011/0089485 A1 | 4/2011 | Gao et al. |
| 2011/0233607 A1* | 9/2011 | Yanagisawa et al. ......... 257/139 |
| 2012/0012929 A1* | 1/2012 | Saito et al. ................... 257/335 |
| 2012/0217577 A1 | 8/2012 | Hashimoto et al. |
| 2012/0241761 A1 | 9/2012 | Asahara |

FOREIGN PATENT DOCUMENTS

| | | |
|---|---|---|
| JP | 2002-353456 A | 12/2002 |
| JP | 2005-340626 A | 12/2005 |
| JP | 2007-165380 A | 6/2007 |
| JP | 2008-311301 A | 12/2008 |
| JP | 2011-040781 A | 2/2011 |
| JP | 2012-178389 A | 9/2012 |
| JP | 2012-204590 A | 10/2012 |
| JP | 2013-508980 A | 3/2013 |

* cited by examiner

SEMICONDUCTOR DEVICE

TECHNICAL FIELD

The present invention relates to a structure of a trench gate-type semiconductor device configured to perform a switching operation.

BACKGROUND ART

Since an insulated gate bipolar transistor (IGBT) has a high input impedance and a low on-voltage, it is used in a motor driving circuit and the like. However, the IGBT has a tradeoff relation between a withstanding voltage and an on-voltage.

As a result, a variety of methods has been suggested so as to lower the on-voltage while keeping the withstanding voltage high. For example, a structure has been suggested in which an n-type layer (hereinafter, referred to as a 'carrier accumulation layer'), which has an impurity concentration higher than a drift region and holes are accumulated therein, is formed between a base region and the drift region. According to the structure, the holes are suppressed from reaching an emitter electrode from a collector region, so that the on-voltage can be lowered (for example, refer to Japanese Patent Application Publication No. 2002-353456A).

SUMMARY OF THE INVENTION

However, in order to realize a semiconductor device having the carrier accumulation layer, a process for forming the carrier accumulation layer is required, thereby increasing the manufacturing process of the semiconductor device. Also, according to the method of arranging the carrier accumulation layer having the higher impurity concentration than the drift region, it is difficult to favorably broaden a depletion layer, so that it is not possible to sufficiently solve the tradeoff between the withstanding voltage and the on-voltage.

Regarding the above, the applicant found out that an on-resistance can be lowered by widening a width of a recess in the IGBT. However, there is a problem that a feedback capacity Crss is increased in the IGBT where the width of the recess is widened.

The present invention provides a trench gate-type semiconductor device capable of sufficiently solving a tradeoff between a withstanding voltage and an on-voltage and reducing a feedback capacity.

According to one aspect of the present invention, provided is semiconductor device including: a first semiconductor region, which has a first conductivity type; a second semiconductor region, which has a second conductivity type and is arranged on the first semiconductor region; a third semiconductor region, which has the first conductivity type and is arranged on the second semiconductor region; a fourth semiconductor region, which has the second conductivity type and is arranged on the third semiconductor region; an insulation film, which is arranged on an inner wall of a recess that extends from an upper surface of the fourth semiconductor region and reaches the second semiconductor region with penetrating the fourth semiconductor region and the third semiconductor region; a control electrode, which is arranged on the insulation film on a side surface of the recess and faces the third semiconductor region; a first main electrode, which is electrically connected to the first semiconductor region, and a second main electrode, which is electrically connected to the fourth semiconductor region, wherein a ratio of a width of the recess to a width of the third semiconductor region contacting the second main electrode is 1 or larger.

According to another aspect of the present invention, provided is semiconductor device including: a first semiconductor region, which has a first conductivity type; a second semiconductor region, which has a second conductivity type and which arranged on the first semiconductor region; a third semiconductor region, which has the first conductivity type and which is arranged on the second semiconductor region; a fourth semiconductor region, which has the second conductivity type and which is arranged on the third semiconductor region; an insulation film, which is arranged on an inner wall of a recess that extends from an upper surface of the fourth semiconductor region and reaches the second semiconductor region with penetrating the fourth semiconductor region and the third semiconductor region; a control electrode arranged on the insulation film on a side surface of the recess and facing the third semiconductor region; a first main electrode electrically connected to the first semiconductor region, and a second main electrode electrically connected to the fourth semiconductor region, wherein a ratio of a total area of the recess on an extension line of an interface between the second semiconductor region and the third semiconductor region to a total area of a region of the third semiconductor region contacting the second main electrode is 1 or larger.

According to the present invention, it is possible to provide the trench gate-type semiconductor device capable of sufficiently solving the tradeoff between the withstanding voltage and the on-voltage and reducing the feedback capacity.

BRIEF DESCRIPTION OF THE DRAWINGS

FIGS. 3A and 3B are simulation results showing a situation where holes are accumulated in the semiconductor device, in which FIG. 3A shows a case where the width of the recess is 2 μm and FIG. 3B shows a case where the width of the recess is 1 μm.

FIG. 4B shows a case where the recess width is 1 μm.

DETAILED DESCRIPTION

Figure 1:
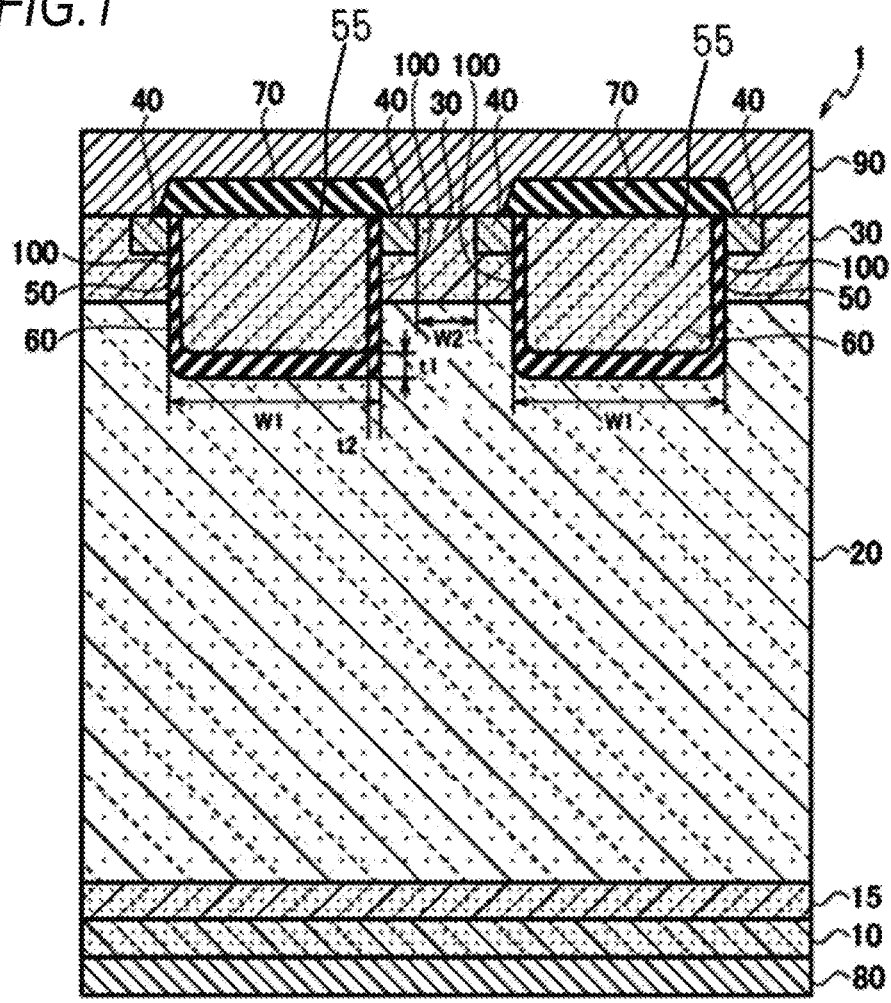
FIG. 1 is a schematic sectional view illustrating a structure of a semiconductor device according to an illustrative embodiment of the present invention.

In the below, illustrative embodiments of the present invention will be described with reference to the drawings. In the drawings, the same or similar parts are denoted with the same or similar reference numerals. It should be noted that the drawings are just schematic, and a relation between a thickness and a planar size, a ratio of lengths of respective parts and the like are different from the actual ones. Therefore, the specific sizes should be determined, considering the below descriptions. Also, the drawings include parts that are different as regards the size relation and ratio of the parts.

Meanwhile, the illustrative embodiments described below exemplify an apparatus and a method for embodying the technical spirit of the present invention, and the technical spirit of the present invention is not specified to the below descriptions as regards shapes, structures, arrangement and the like of the constitutional components. The illustrative embodiments of the present invention can be variously changed within the scope of the claims.

A semiconductor device 1 according to a first illustrative embodiment of the present invention shown in FIG. 1 has a first semiconductor region 10 of a first conductivity type, a second semiconductor region 20 of a second conductivity type arranged on the first semiconductor region 10, a third semiconductor region 30 of the first conductivity type arranged on the second semiconductor region 20, fourth semiconductor regions 40 of the second conductivity type separated from each other on the third semiconductor region 30, an insulation film 50, which is arranged on inner walls of recesses that extends from upper surfaces of the fourth semiconductor regions 40 and reaches the second semiconductor region 20 with penetrating the fourth semiconductor regions 40 and the third semiconductor region 30 and which faces bottom parts of the recesses and side surfaces of the third semiconductor region 30, a control electrode 60 arranged on the insulation film 50 in the recesses, a first main electrode 80 electrically connected to the first semiconductor region 10 and a second main electrode 90 electrically connected to the third semiconductor region 30 and the fourth semiconductor regions 40.

The first conductivity type and the second conductivity type are opposite conductivity types. That is, in a case where the first conductivity type is an n-type, the second conductivity type is a p-type, and in a case where the first conductivity type is a p-type, the second conductivity type is an n-type. In the below, a configuration where the first conductivity type is a p-type and the second conductivity type is an n-type is exemplified.

As described above, the semiconductor device 1 shown in FIG. 1 is a trench gate-type IGBT. In order to easily understand the descriptions, the first semiconductor region 10 is referred to as a p-type collector region 10, the second semiconductor region 20 is referred to as an n-type drift region 20, the third semiconductor region 30 is referred to as a p-type base region 30 and the fourth semiconductor region 40 is referred to as an n-type emitter region 40. Meanwhile, in the example of FIG. 1, an n-type buffer layer 15 is arranged between the drift region 20 and the collector region 10.

A plurality of the emitter regions 40 is selectively embedded in parts of an upper surface of the base region 30. Also, the control electrode 60 is referred to as a gate electrode 60, the first main electrode 80 is referred to as a collector electrode 80 and the second main electrode 90 is referred to as an emitter electrode 90. A surface of the base region 30 facing the gate electrode 60 is a channel forming region. That is, a region of the insulation film 50 formed on the side surface of the recess 55 functions as a gate insulation film.

In a semiconductor substrate, impurity concentrations and thicknesses of the respective semiconductor regions are exemplified as follows. A thickness of the emitter region 40 is about 0.3 µm or greater and 1 µm or less and an impurity concentration of the emitter region 40 is about $1 \times 10^{18}$ cm$^{-3}$ to $1 \times 10^{20}$ cm$^{-3}$. Also, a thickness of the base region 30 is about 4 µm and an impurity concentration of the base region 30 is about $5 \times 10^{16}$ cm$^{-3}$ to $1 \times 10^{18}$ cm$^{-3}$. Also, it is preferable that a thickness of the drift region 20 is 40 µm or greater and 140 µm or less and a specific resistance of the drift region 20 is 10 Ωcm or greater and 150 Ωcm or less. Also, a thickness of the collector region 10 is 1 μm to 300 μm and an impurity concentration of the collector region 10 is about $1\times10^{17}$ cm$^{-3}$ to $1\times10^{19}$ cm$^{-3}$.

In the semiconductor device 1 shown in FIG. 1, a width W1 of the recess 55 is larger than an interval between the adjacent recesses 55. Further, the width W1 of the recess 55 is larger than a depth of the recess 55. In the semiconductor device 1 shown in FIG. 1, the width W1 of the recess 55 is 3 μm to 15 μm and a depth of the recess 55 is set to 2 μm to 10 μm. Meanwhile, the width W1 of the recess 55 described in the present invention indicates a width at a position on an extension line of an interface between the base region 30 and the drift region 20, as shown in FIG. 1. Also, a width of the base region 30 exposed on a surface of the semiconductor substrate 100 between the recesses 55, i.e., a width of a contact part between the base region 30 and the emitter electrode 90 is referred to as a 'connection region width' and is denoted with a width W2 in FIG. 1. In the meantime, the connection region width is a width along a direction perpendicular to an extension direction of the recess 55, which is perpendicular to the sheet of FIG. 1. That is, the connection region width means a length in a direction parallel with the width direction of the recess 55.

An interlayer insulation film 70 has an opening between the adjacent recesses 55. The emitter electrode 90 arranged to cover the surface of the semiconductor substrate is arranged on upper surfaces of the base region 30 and the emitter region 40 through the opening. By the above-described configuration, the emitter electrode 90 is electrically connected to the base region 30 and the emitter region 40 on the surface of the semiconductor substrate.

Here, operations of the semiconductor device 1 shown in FIG. 1 are described. A predetermined collector voltage is applied between the emitter electrode 90 and the collector electrode 80 and a predetermined gate voltage is applied between the emitter electrode 90 and the gate electrode 60. For example, the collector voltage is about 300V to 1,600V and the gate voltage is about 10V to 20V. When the semiconductor device 1 becomes on in this way, the conductivity type is reversed from the p-type to the n-type in the channel region, so that a channel is formed. The electrons from the emitter region 40 are injected into the drift region 20 through the formed channel. By the injected electrons, a forward bias is formed between the collector region 10 and the drift region 20, so that the holes are moved from the collector region 10 in order of the drift region 20 and the base region 30. When the current is further increased, the holes from the collector region 10 are increased and the holes are accumulated below the base region 30. As a result, an on-voltage is lowered by the conductivity modulation.

When switching the semiconductor device 1 from an on-state to an off-state, a gate voltage is lowered below a threshold voltage, so that the gate voltage is controlled to have the same potential as an emitter voltage or a negative potential and the channel is thus removed, for example. Thereby, the injection of the electrons from the emitter region 40 to the drift region 20 is stopped. Since the potential of the collector electrode 80 is higher than the emitter electrode 90, a depletion layer is broadened from the interface between the base region 30 and the drift region 20. Also, the holes accumulated in the drift region 20 are discharged to the emitter electrode 90 through the base region 30 formed between the adjacent recesses 55. That is, a contact part of the base region 30 and the emitter electrode 90 between the recess 55 and the recess 55 is an ejection port of the holes.

Figure 2:
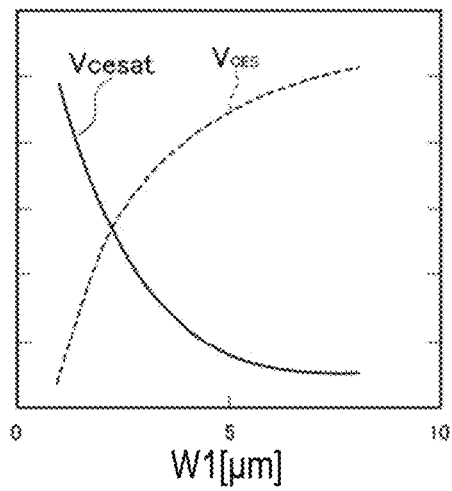
FIG. 2 is a graph showing a relation of a width of a recess of the semiconductor device and a voltage between a collector and an emitter and a saturation voltage between the collector and the emitter, according to the illustrative embodiment of the present invention.

FIG. 2 shows a relation of the width W1 of the recess 25 of the semiconductor device 1 and a voltage $V_{CES}$ between a collector and an emitter upon a short between a gate and the emitter and a saturation voltage $V_{cesat}$ between the collector and the emitter. The saturation voltage $V_{cesat}$ between the collector and the emitter corresponds to the on-voltage. In the meantime, the interval between the adjacent recesses 55 and the connection region width W2 are set to be constant. The lower saturation voltage $V_{cesat}$ between the collector and the emitter is preferable and the higher voltage $V_{CES}$ between the collector and the emitter is preferable. It can be seen from FIG. 2 that the on-voltage is lowered as the width W1 of the recess 55 is widened. The reason will be described below.

When a predetermined collector voltage is applied between the emitter electrode 90 and the collector electrode 80 and a predetermined gate voltage is applied between the emitter electrode 90 and the gate electrode 60, so that the semiconductor device 1 becomes on, the channel region is reversed from the p-type to the n-type and a channel is thus formed. The electrons passing through the formed channel and mainly moving from the emitter electrode 90 along the side surfaces of the recess 25 are injected to the drift region 20. By the injected electrons, a forward bias is formed between the collector region 10 and the drift region 20, so that the holes are moved from the collector region 10 to the drift region 20.

The holes moved from the collector region 10 are suppressed from moving by the bottom part of the recess 55 and are thus accumulated below the recess 55. As the width W1 of the recess 55 is wider, an amount of accumulation of the holes below the recess 55 is increased and an amount of accumulation of the holes at the bottom part of the recess 55 and in the vicinity thereof is also increased.

Also, the thickness of the drift region 20 below the bottom part of the recess 55 is sufficiently larger, as compared to the width W1 of the recess 55, and is at least 40 μm or greater. Therefore, not only the interface between the collector region 10 and the drift region 20 at an extension part of the channel, also the interface between collector region 10 and the drift region 20 in the wider range than that becomes the forward bias, so that the holes can be easily moved from the collector region 10 to the drift region 20. As a result, a total amount of accumulation of the holes accumulated in the drift region 20 at the extension part of the channel and in the vicinity thereof is increased, and the conductivity modulation is further reinforced, so that the on-voltage is lowered.

Figure 3A:
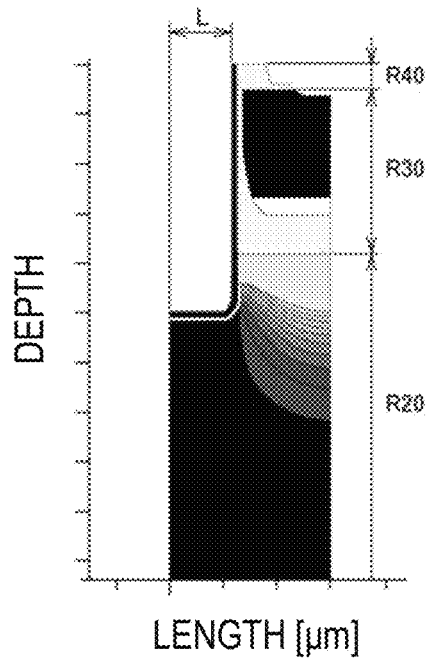
Figure 3B:
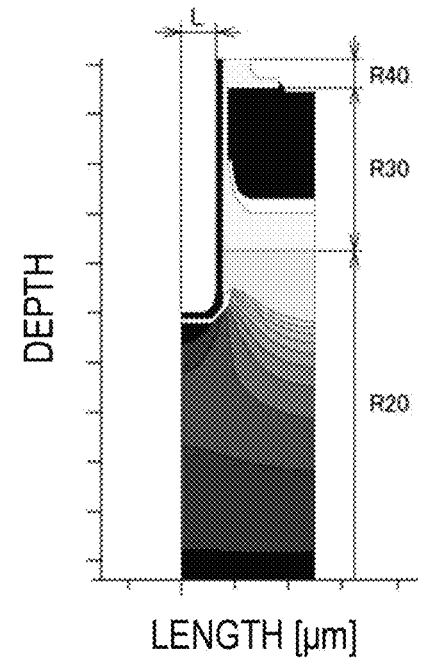

FIG. 3A is a simulation result showing an accumulation situation of the holes in a case where the width W1 of the recess 55 is 2 μm. For reference, FIG. 3B is a simulation result obtained in a case where the width of the recess 55 is narrower than FIG. 3A. That is, FIG. 3B is a simulation result obtained in a case where the width of the recess 55 is 1 μm. In FIGS. 3A and 3B, a horizontal axis indicates the width of the recess 55, and a vertical axis indicates a depth from a surface (an opening) of the recess 55. In the meantime, a region R20 indicates a position of the drift region 20, a region R30 indicates a position of the base region 30 and a region R40 indicates a position of the emitter region 40. A region in which a density of the accumulated holes is higher is shown to be darker. That is, in a case where the width W1 of the 55 is 2 μm, the holes are accumulated in the extension part of the channel close to the bottom part of the recess 55 and in the drift region 20 at the periphery thereof.

Subsequently, the hole ejection by the connection region will be described. The connection region width W2 of the base region 30 contacting the emitter electrode 90 is a length of a part through which the holes are moved to the base region 30 and the emitter electrode 90. As described later, since the width W1 is sufficiently narrower than the width W2, for example 1 to ⅙, an amount of the holes moving to the emitter electrode 90 is decreased and the holes are accumulated in the drift region 20 in the vicinity of the bottom part of the recess 55. In this way, the conductivity modulation is remarkably reinforced by a synergetic effect of the hole accumulation effect of the recess 55 and the reduction effect of the hole movement to the emitter electrode 90 due to the narrowing of the connection region width W2, so that the semiconductor device 1 in which the on-voltage is sufficiently lowered is realized.

Figure 5:
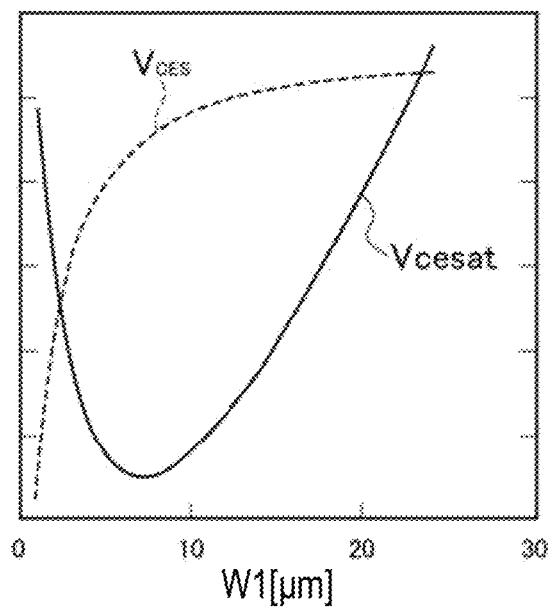
FIG. 5 is another graph showing a relation of the width of the recess of the semiconductor device and the voltage between the collector and the emitter and the saturation voltage between the collector and the emitter, according to the illustrative embodiment of the present invention.

If the connection region width W2 is wide, an amount of the holes moving to the emitter electrode 90 is increased without being accumulated below the base region 30. Therefore, it is preferable that the width W1 of the recess 55 is larger than the connection region width W2 so as to lower the on-voltage. On the other hand, an increase in a chip area is limited due to the cost and the manufacturing process. In a case where the width W1 of the recess 55 is widened at a state where the chip size is constant, the number of channels is reduced. As a result, the effect of increasing the on-voltage due to the reduction in the number of channels is greater than the effect of lowering the on-voltage due to the conductivity modulation resulting from the accumulation of the holes, thereby increasing the on-voltage of the semiconductor device. That is, as shown in FIG. 5, in a case where the width W1 of the recess 55 is excessively widened, a ratio of the channel region occupying the chip size of the semiconductor device is decreased, so that the saturation voltage $V_{cesat}$ between the collector and the emitter is increased. Therefore, it is preferable that the width of the recess is about 3 μm to 20 μm.

It can be seen that in a case where the width W1 of the recess 55 is about 7 μm, the on-voltage is most effectively reduced. In a semiconductor device of the background art, the width W1 of the recess 55 is about 1 μm to 2 μm even if it is wide.

As a result, according to the semiconductor device 1 in which the width W1 of the recess 55 is wide, like this illustrative embodiment, it is possible to reduce the on-voltage without adopting a structure where a carrier accumulation layer is arranged, like the background art.

Also, as shown in FIG. 2, in a case where the width W1 of the recess 55 is widened, it is possible to improve the withstanding voltage of the semiconductor device 1. The reason will be described below. When the semiconductor device 1 is switched from the on state to the off state, the depletion layer is broadened in the drift region 20 from the bottom part of the recess 55 and the periphery thereof as well as from a PN junction interface-side formed between the base region 30 and the drift region 20. At this time, it is preferable that the depletion layer is uniformly broadened and is broadened more extensively. When the depletion layer is non-uniformly broadened or is broadened in a narrow range, the withstanding voltage is lowered. For example, an electric field is concentrated at both end portions of the bottom surface of the recess 55 in a width direction of the recess 55. In a case where the width W1 of the recess 55 is narrow, since a distance between both end portions of the bottom surface of the recess 55 in the width direction of the recess 55 is short, the depletion layer is not broadened favorably uniformly and extensively just below the bottom surface of the recess 55. On the other hand, in a case where the width W1 of the bottom part of the recess 55 is wide, since the distance between both end portions of the bottom surface of the recess 55 is wide, the depletion layer is broadened more uniformly or more extensively just below the bottom part of the recess 25. As a result, the withstanding voltage is improved in the semiconductor device 1 in which the width W1 of the recess 25 is wide.

Figure 4A:
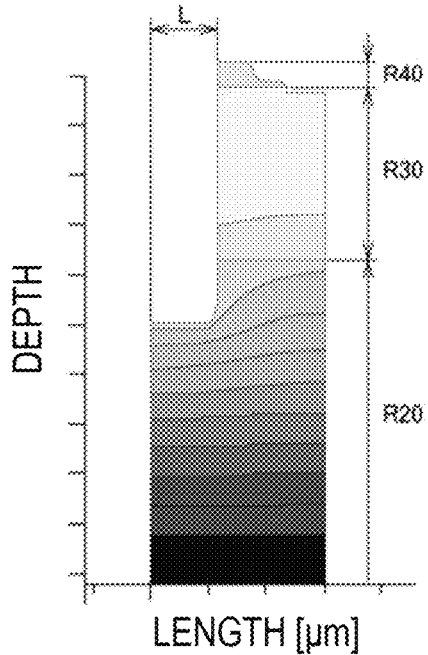
FIGS. 4A and 4B are simulation results showing potential distributions at the periphery of the recess, in FIG. 4A shows a case where the recess width is 2 μm
Figure 4B:
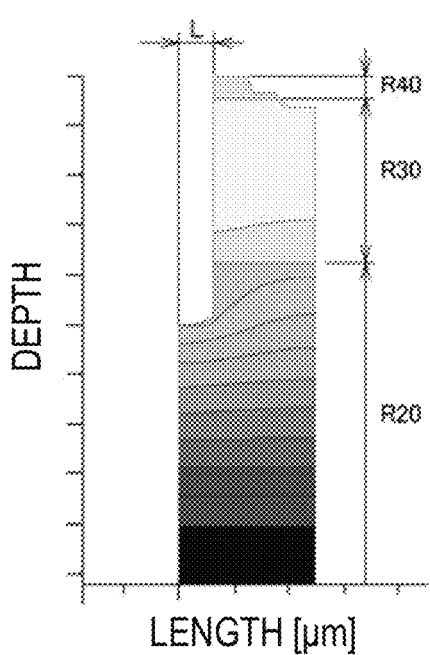

Simulation results of a potential distribution are shown in FIGS. 4A and 4B. FIG. 4A is a simulation result obtained in a case where the width W1 of the bottom surface of the recess 55 is 2 μm, and FIG. 4B is a simulation result obtained in a case where the width W1 of the bottom surface of the recess 55 is 1 μm. In FIGS. 4A and 4B, a vertical axis indicates a depth from the surface of the recess 55. In the meantime, the region R20 indicates a position of the drift region 20, the region R30 indicates a position of the base region 30 and the region R40 indicates a position of the emitter region 40. A region in which the potential is higher is shown to be darker. It can be seen from FIGS. 4A and 4B that the depletion layer is broadened downwardly just below the recess 55. In particular, it is confirmed from the simulations that as the width of the bottom surface of the recess 55 is wider, the potential distribution below the recess 55 is wider and flatter and the electric field is difficult to be concentrated.

Further, since the connection region width W2 is relatively narrow, the withstanding voltage of the semiconductor device 1 is improved. A depth of the depletion layer between the recesses 55 is shallower than that of the depletion layer just below the recess 55. In a case where the connection region width W2 is wide, the interval between the recesses 55 is also widened and then the depletion layer broadening into the drift region 20 from the PN junction between the drift region 20 and the base region 30 in the region between the recesses 55 becomes flatter. As a result, a part at which the corresponding depletion layer continues to a depletion layer broadening from the side of the recess 25 is more distorted. As a result, the withstanding voltage of the semiconductor device 1 is lowered. Therefore, it is preferable that the connection region width W2 is narrow somewhat and the connection region width W2 is set to be equal to or less than the width W1 of the recess 55.

Figure 6:
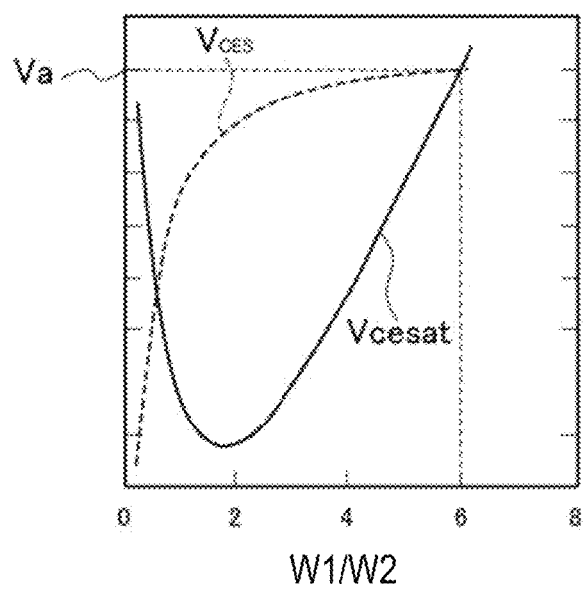
FIG. 6 is a graph showing a relation of a ratio of the width of the recess to a width of a base region contacting an emitter electrode of the semiconductor device and a withstanding voltage $V_{CES}$ between the collector and the emitter and a saturation voltage $V_{cesat}$ between the collector and the emitter, according to the illustrative embodiment of the present invention.

FIG. 6 shows a relation of a ratio W1/W2, which is a ratio of the width W1 of the recess 55 to the connection region width W2, and the withstanding voltage $V_{CES}$ between the collector and the emitter upon the short between the gate and the emitter and the saturation voltage $V_{cesat}$ between the collector and the emitter. As already described, the saturation voltage $V_{cesat}$ between the collector and the emitter corresponds to the on-voltage. A voltage value Va in FIG. 6 is the saturation voltage $V_{cesat}$ between the collector and the emitter of the semiconductor device of the background art. In order to increase the withstanding voltage and to lower the on-voltage in the semiconductor device 1, it is preferable that the connection region width W2 and the width W1 of the recess 55 satisfy a relation of a following equation (1).

$$1 \leq W1/W2 \leq 6 \tag{1}$$

In a case where the ratio W1/W2 of the width W1 of the recess to the connection region width W2 is set to be 1 or larger and 6 or smaller as shown in the equation (1), it is possible to lower the on-voltage.

Meanwhile, since the width W1 of the recess is wider than the background art, it is possible to lower the on-voltage and also it is possible to reduce the number of the recesses within the range in which the connection region width W2 and the width W1 of the recess satisfy the equation (1). Thereby, the total number of the channels is reduced, and then a parasitic capacitance Cge between the gate electrode 60 and the semiconductor layer on the side surfaces of the recess 25, which occurs between the base region 30 and emitter region 40 facing the gate electrode 60, can be reduced. Also, the width W1 of the recess is widened and a cell pitch is widened, so that a total amount of the channels is reduced and the channel resistance is increased. As a result, the current flowing through the semiconductor device 1 upon the load short is limited. That is, according to the semiconductor device 1, it is possible to secure a short circuit capacity.

The gate electrode 60 is configured by polysilicon, for example. The width W1 of the recess is wider, as compared to the background art, so that a gate resistance is lowered. Thereby, the semiconductor device 1 can operate at high speed, and in a case where many elements are arranged in the same chip, it is possible to accomplish the uniform element operation in the semiconductor device 1. In the meantime, the impurity concentration of the gate electrode 60 is $1 \times 10^{19}/cm^3$ or greater and $1 \times 10^{20}/cm^3$ or less.

In the meantime, in order to lower the on-voltage of the semiconductor device 1, it is more preferable that the connection region width W2 and the width W1 of the recess satisfy a relation of a following equation (2).

$$1.5 \leq W1/W2 \leq 3 \tag{2}$$

It is further preferable that, the connection region width W2 and the width W1 of the recess satisfy a relation of a following equation (3).

$$1.7 \leq W1/W2 \leq 2 \tag{3}$$

As shown in FIG. 6, the on-voltage is lowest in a case where the connection region width W2 and the width W1 of the recess satisfy the relation of the equation (3).

Figure 7:
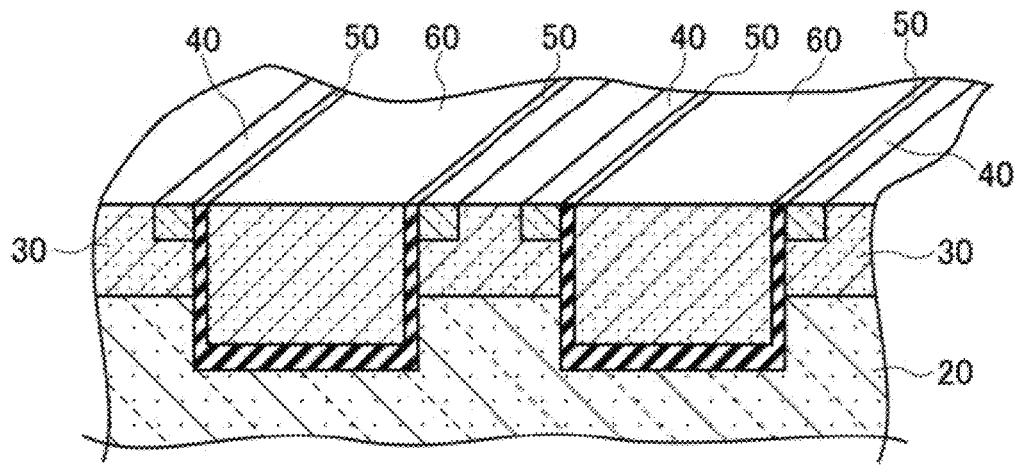
FIG. 7 is a schematic perspective view illustrating an arrangement example of the emitter electrodes in the semiconductor device according to a first illustrative embodiment of the present invention.
Figure 8:
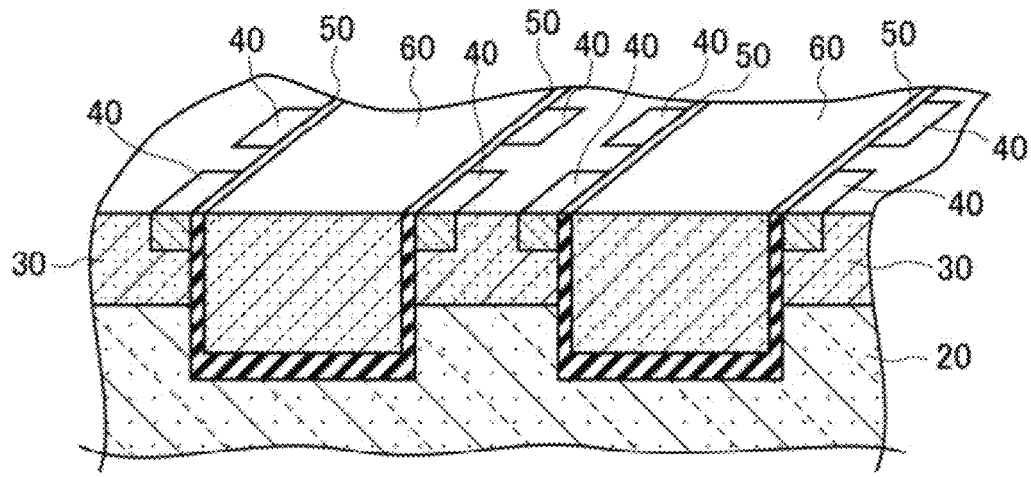
FIG. 8 is a schematic perspective view illustrating another arrangement example of the emitter electrodes in the semiconductor device according to the first illustrative embodiment of the present invention.
Figure 21:
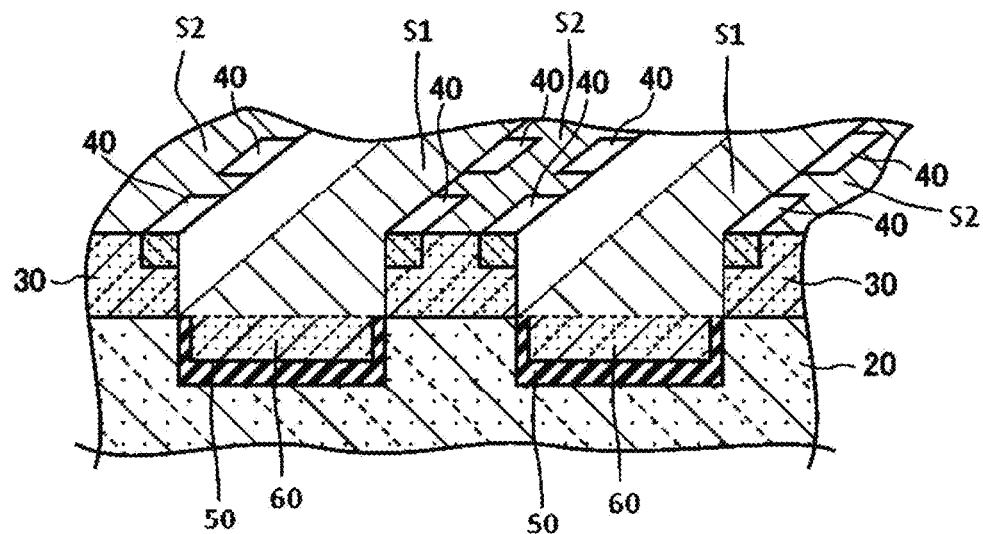
FIG. 21 illustrates parts corresponding to a total area of the recess facing an emitter electrode 90 on an extension line of an interface between a drift region 20 and a base region 30 in FIG. 8 and a total area of the base region 30 contacting the emitter electrode 90.

In the meantime, the simulation results shown in FIGS. 3A and 4A and the relation equation of the ratio W1/W2 are obtained with respect to the structure where the emitter region 40 is continuously formed along the recess, as shown in FIG. 7. However, as shown in FIG. 8, the emitter region 40 may be dispersedly arranged along the recess. In the structure of FIG. 8, a total area S2 of the base region 30 contacting the emitter electrode 90 replaces the connection region width W2, and a total area S1 of the recess facing the emitter electrode 90 on the extension line of the interface between the drift region 20 and the base region 30 becomes the width W1 of the recess, so that the above-described relation equation is obtained. That is, the relation of the ratio W1/W2, which is a ratio of the width W1 of the recess to the connection region width W2, is replaced with a ratio of the total area S1 of the recess at the same plane level as the interface between the drift region 20 and the base region 30 to the total area S2 of the region of the base region 30 contacting the emitter electrode 90 (hereinafter, referred to as 'area ratio S'). Therefore, the area ratio S is 1 or larger, preferably, 1 or larger and 6 or smaller. Also, it is more preferable that the area ratio S is 1.5 or larger and 3 or smaller, further preferably, 1.7 or larger and 2 or smaller. In the meantime, FIG. 21 illustrates parts corresponding to the total area S1 of the recess 55 facing the emitter electrode 90 on the extension line of the interface between the drift region 20 and the base region 30 in FIG. 8 and the total area S2 of the base region 30 contacting the emitter electrode 90.

Meanwhile, the insulation film 50 is formed so that a thickness t1 of the region thereof arranged on the bottom surface of the recess is thicker than a thickness t2 of the region arranged on the side surfaces of the recess and facing the base region 30. In the semiconductor device 1, since the width W1 of the recess in which the gate electrode 60 is formed is wide, the parasitic capacitance Cdg occurring between the gate electrode 60 on the bottom surface-side of the recess and the semiconductor region tends to increase. However, it is possible to reduce the parasitic capacitance Cdg by thickening the insulation film 50 on the bottom surface of the recess.

In the semiconductor device 1, the film thickness of the insulation film 50 on the lower side of the gate electrode is thickened, thereby reducing the parasitic capacitance Cdg. On the other hand, as the entire thickness of the insulation film 50 is thickened, a problem of a threshold voltage occurs. That is, since the side surfaces of the insulation film 50 function as a gate insulation film, if the film thickness of the insulation film 50 on the side surfaces is thickened, the threshold voltage is increased. As a result, in the semiconductor device 1, the film thickness of the insulation film 50 on the side surfaces is made to be thin and the film thickness of the insulation film 50 on the bottom surface is made to be thick. Thereby, it is possible to reduce the parasitic capacitance Cdg while keeping a desired threshold voltage. The film thickness t1 of the insulation film 50 on the bottom surface of the recess 55 is about 300 nm, for example, and the film thickness t2 thereof on the side surface of the recess 55 is about 100 nm, for example.

As described above, according to the semiconductor device 1 of the illustrative embodiment of the present invention, the width W1 of the recess in which the gate electrode 60 is formed is set to be wide and the connection region width W2, which is the width of the base region 30 contacting the emitter electrode 90 between the recesses, is set to be equal to or smaller than the width W1 of the recess. As a result, according to the semiconductor device 1, the holes are likely to be accumulated in the vicinity of the bottom part of the recess. As a result, it is possible to provide the semiconductor device having the high withstanding voltage and low on-voltage with suppressing the increase in the manufacturing processes.

Figure 11:
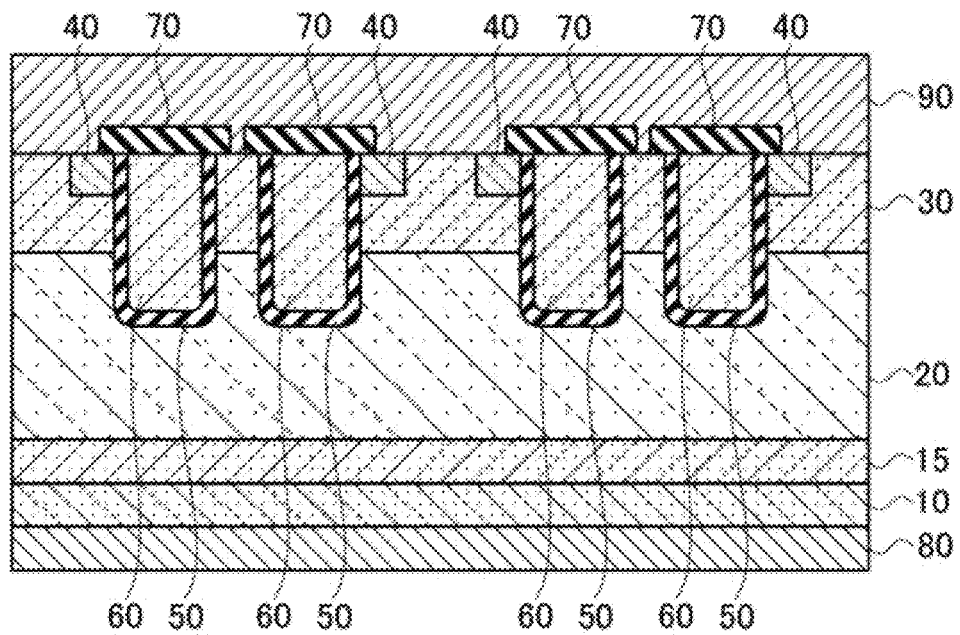
FIG. 11 is a schematic sectional view illustrating a structure of a semiconductor device, which is a comparative example of the semiconductor device according to the first illustrative embodiment of the present invention.

FIG. 11 is a comparative example of the semiconductor device 1. The comparative example has a structure different from the semiconductor device 1 of FIG. 1. For example, according to a structure where a plurality of recesses is formed in one cell, a sectional area of the gate electrode is substantially increased, thereby reducing a resistance (gate resistance) of the gate electrode. In the comparative example of FIG. 11, two recesses are formed in one cell. However, the number of recesses is increased, so that the parasitic capacitance is also increased.

In contrast, in the semiconductor device 1, one recess is formed in one cell. Thereby, the problem that the parasitic capacitance occurring between the gate electrode 60 and the base region 30 and emitter region 40 facing the gate electrode is increased is solved. Further, since the width W1 of the recess is widened without forming a plurality of recesses, the gate resistance is decreased and the problem of the withstanding voltage lowering is also solved.

A manufacturing method of the semiconductor device 1 of the illustrative embodiment of the present invention will be described with reference to FIGS. 12 to 16. In the meantime, the manufacturing method described below is just exemplary, and the semiconductor device can be implemented by a modified embodiment thereof and a variety of other manufacturing methods.

Figure 12:
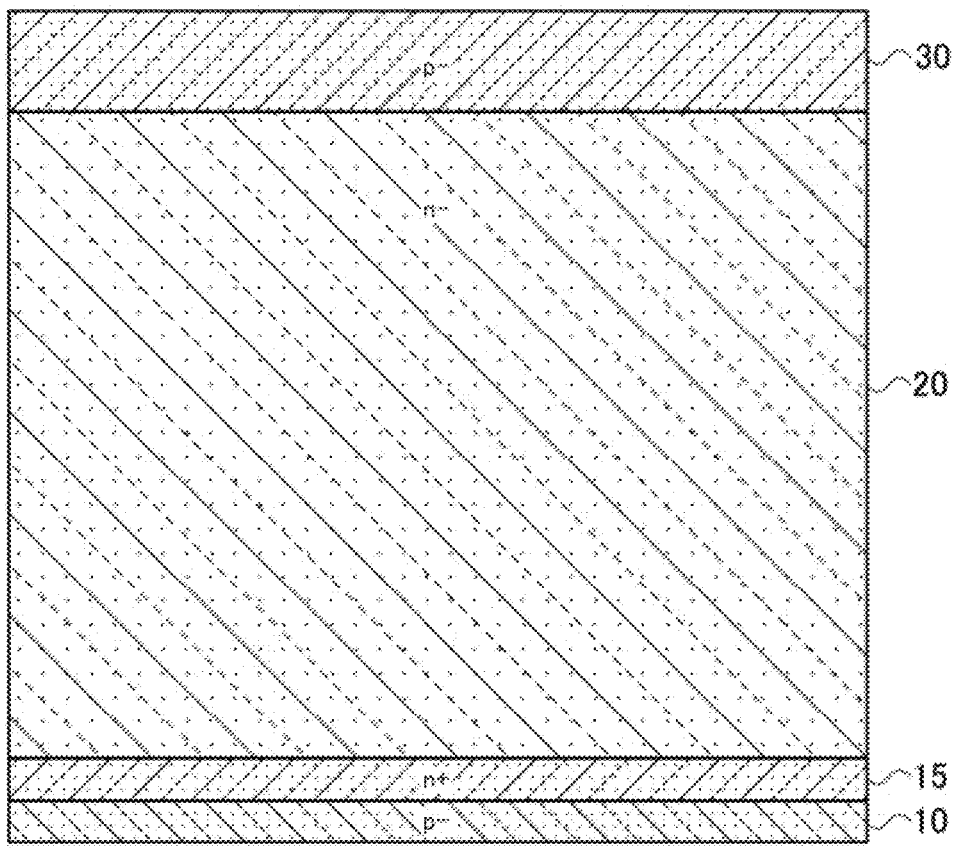
FIG. 12 is a schematic process sectional view (1) illustrating a manufacturing method of the semiconductor device according to the first illustrative embodiment of the present invention.
Figure 13:
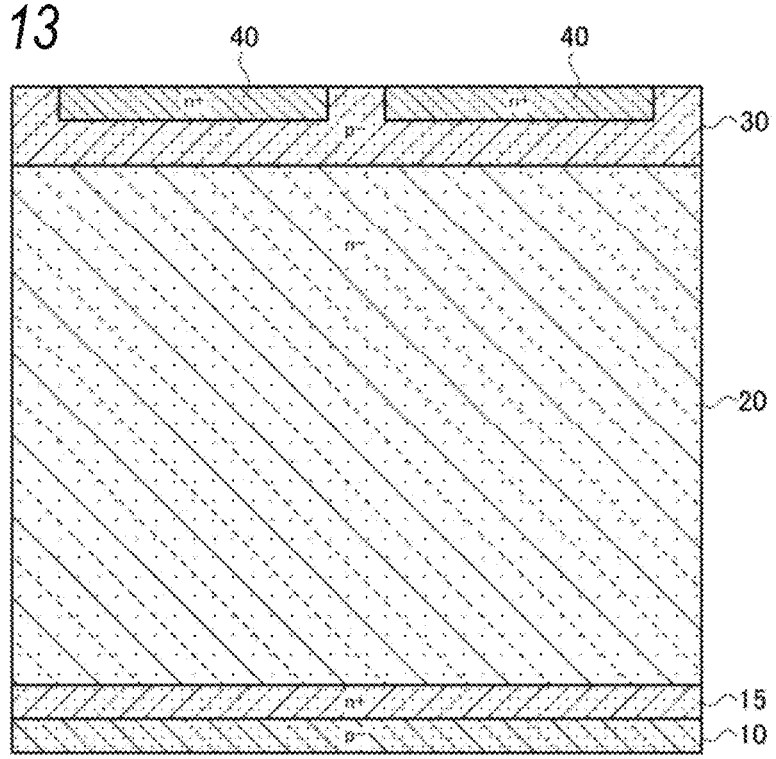
FIG. 13 is a schematic process sectional view (2) illustrating the manufacturing method of the semiconductor device according to the first illustrative embodiment of the present invention.

As shown in FIG. 12, the p⁻-type base region 30 is formed on the n⁻-type drift region 20, which is formed on a stacked member of the p⁻-type collector region 10 and the n⁺-type buffer layer 15, by an impurity diffusion method or epitaxial growth method. For example, according to the impurity diffusion method, p-type impurities are implanted into the drift region 20 from an upper surface of the drift region 20 by an ion implantation method and then the diffusion is made by anneal processing, so that the base region 30 is formed to have the substantially uniform thickness. The p-type impurities in the base region 30 are boron (B), for example. Subsequently, as shown in FIG. 13, the n+-type emitter regions 40 are formed in parts of an upper surface of the base region 30 by the ion implantation method and the diffusion, for example.

Figure 14:
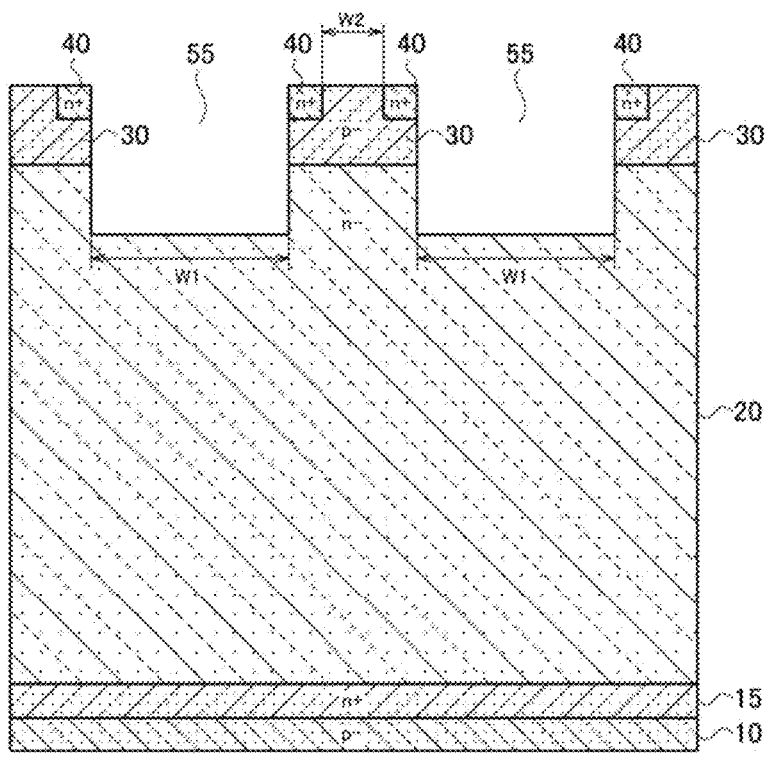
FIG. 14 is a schematic process sectional view (3) illustrating the manufacturing method of the semiconductor device according to the first illustrative embodiment of the present invention.

Thereafter, as shown in FIG. 14, by photolithography and etching technologies, the recesses 55 extending from upper surfaces of the emitter regions 40 and penetrating the emitter regions 40 and the base region 30 such that tips of the recesses reach the drift region 20 are formed. The bottom surface of the recess 55 is substantially flat.

At this time, the recesses 55 are formed such that the connection region width W2 is equal to or smaller than the width W1 of the recess 55. As described above, it is preferable that the ratio W1/W2 of the width W1 of the recess 55 to the connection region width W2 is 1 or larger and 6 or smaller. In the meantime, it is more preferable that the ratio W1/W2 is 1.5 or larger and 3 or smaller, further preferably 1.7 or larger and 2 or smaller.

Figure 15:
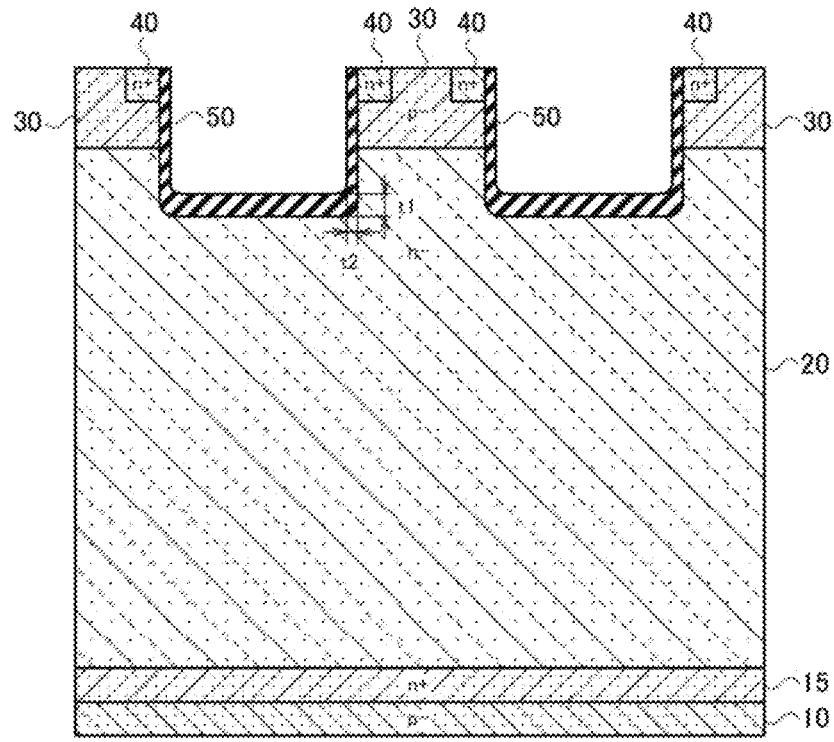
FIG. 15 is a schematic process sectional view (4) illustrating the manufacturing method of the semiconductor device according to the first illustrative embodiment of the present invention.

Then, as shown in FIG. 15, the insulation film 50 is formed on the inner wall of the recess 55. For example, a silicon oxide (SiO$_2$) film is formed by a thermal oxidation method. At this time, the insulation film 50 is formed so that the film thickness t1 of the region thereof arranged on the bottom surface of the recess 55 is thicker than the film thickness t2 of the region arranged on the side surfaces of the recess 55.

Figure 16:
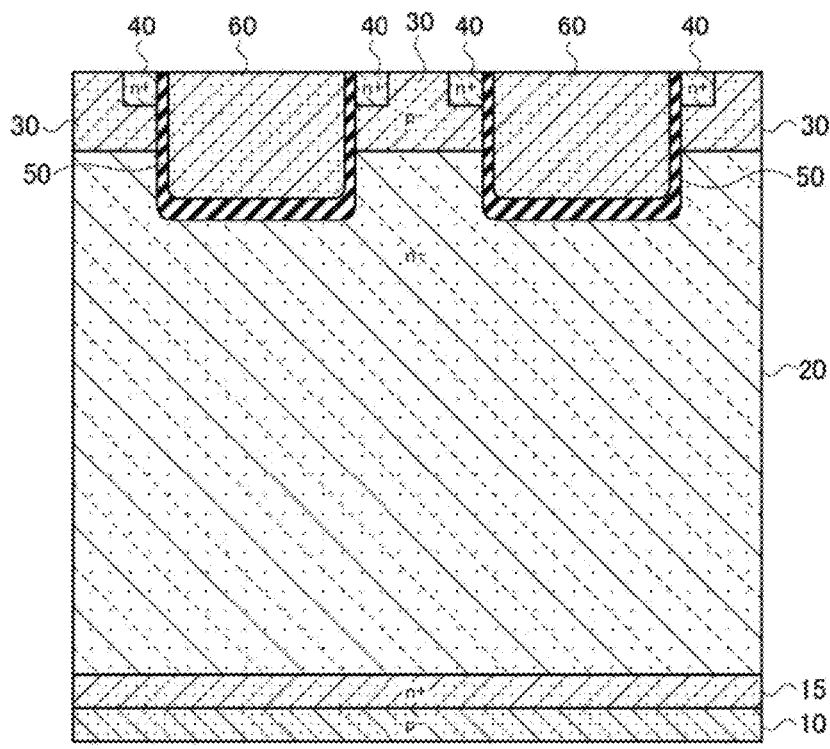
FIG. 16 is a schematic process sectional view (5) illustrating the manufacturing method of the semiconductor device according to the first illustrative embodiment of the present invention.

Subsequently, the gate electrode 60 is formed. For example, a polysilicon film having impurities added thereto is embedded in the recess and the surface of the base region 30 is flattened by a polishing process such as chemical mechanical polishing (CMP), as shown in FIG. 16, so that the gate electrode 60 is formed.

Further, after the interlayer insulation film 70 is formed on the gate electrode 60, the emitter electrode 90 connecting to the emitter regions 40 and the base region 30 is formed on the interlayer insulation film 70. Further, the collector electrode 80 is formed on a backside of the collector region 10, so that the semiconductor device 1 shown in FIG. 1 is completed.

As described above, according to the manufacturing method of the semiconductor device 1 of the first illustrative embodiment of the present invention, the semiconductor device in which the connection region width W2 is equal to or smaller than the width W1 of the recess is manufactured. Therefore, it is possible to obtain the semiconductor device 1 in which the holes are likely to be accumulated in the vicinity of the bottom part of the recess and the withstanding voltage is high and in which the on-voltage is low and the increase in the manufacturing processes thereof is suppressed.

Figure 9:
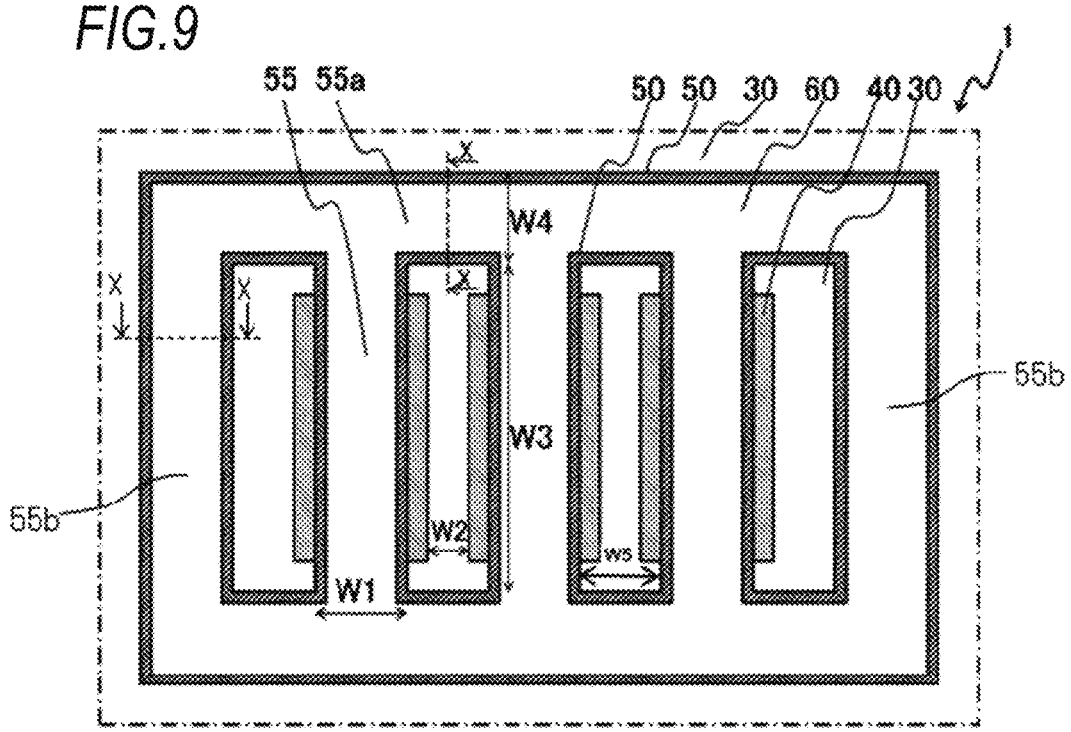
FIG. 9 is a schematic plan view illustrating a structure of the semiconductor device according to the first illustrative embodiment of the present invention.

Also, a plan view of the semiconductor device 1 is shown in FIG. 9. As shown in FIG. 9, a plurality of recesses 55, of which a length W3 in the extension direction of the recess 55 is equal to or larger than the width W1 of the recess 55, is arranged in parallel. Further, at least one recess (outer recess) 55b is arranged in parallel with the extension direction of the recess 55 at the left and right outermost sides of the recesses 55 on the sheet of FIG. 5. The emitter regions 40 are arranged at both sides of the recess 55. In the meantime, the emitter region 40 is not arranged on a sidewall of an opening of the outer recess 55b at least at the outer periphery-side of the semiconductor substrate 100. Also, the outer recesses 55b penetrates at least the base region 30 and reaches the drift region 20.

Also, as shown in FIG. 9, the semiconductor device 1 has a connection recess 55a configured to connect the adjacent recesses 55 and the outer recesses 55b. The emitter region 40 is not also formed at the periphery of an opening of the connection recess 55a. Also, the connection recess 55a is formed to penetrate at least the base region 30 and to reach the drift region 20.

The connection recess 55a extends in the arrangement direction of the plurality of recesses 55 and is connected to end portions of the recesses 55 arranged at the outermost sides.

The connection recess 55a includes the connection recess 55a (a first connection recess) connected to one end portions of the recesses 55 and the connection recess 55a (a second connection recess) connected to the other end portions of the recesses 55. The plurality of recesses 55 is arranged in a region in which the first connection recess and the second connection recess face each other.

Therefore, an inner side of a region surrounded by the outer recesses 55b and the connection recesses 55a is a region including an active region in which a semiconductor element is formed, and an outer side including the region surrounded by the outer recesses 55b and the connection recesses 55a is an outer periphery region surrounding the active region.

In the recess 55 and the outer recess 55b, the gate electrode 60 is arranged with extending in a stripe shape in the recess 55 so that it reaches the connection recesses 55a at both sides of the recess 55. In the meantime, the emitter electrode 90 and the like are not shown. Also, FIG. 9 shows only three recesses 55 but is just schematic. Actually, more recesses 55 are arranged in parallel. Also, as described above, the area ratio S is configured to be 1 or larger, specifically, 1 or larger and 6 or smaller.

Figure 10:
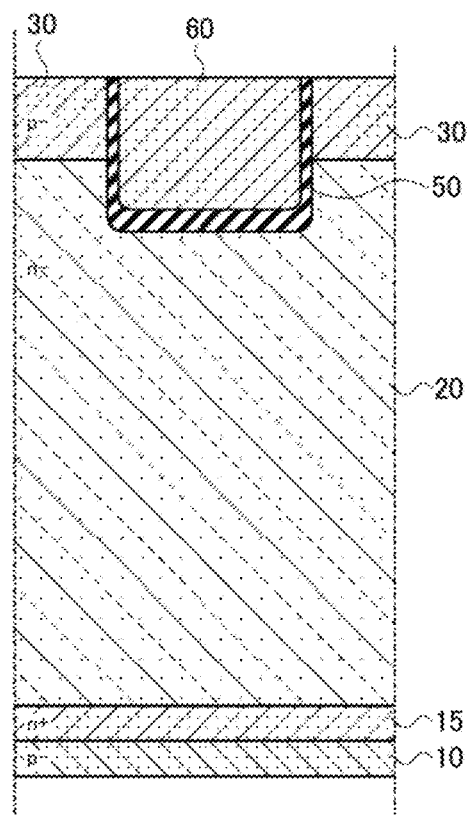
FIG. 10 is a schematic sectional view illustrating a connection recess 55a and an outer recess 55b, which is taken along a line X-X of FIG. 9.

FIG. 10 is a schematic sectional view illustrating the connection recess 55a and the outer recess 55b, which is taken along a line X-X of FIG. 9. Although the structures of the connection recess 55a and the outer recess 55b are similar to that of the recess, the emitter region 40 is not formed therein. Here, it is preferable that a width W4 of the connection recess 55a in a longitudinal direction of the recess 55 and a width W4 of the outer recess 55b in the arrangement direction of the recesses 55 are 3 μm to 20 μm. Thereby, the holes can be accumulated below the connection recess 55a and also the outer recess 55b, so that the on-voltage can be lowered. Also, the length W3 of the recess is larger than the width W1 of the recess 55 and the width W4 of the connection recess 55a.

In this way, as the outer recess 55b and the connection recess 55a are provided, it is possible to accumulate the holes just below the outer recess 55b and the connection recess 55a and in the drift region 20 in the vicinity thereof, thereby generating the conductivity modulation. As a result, it is possible to further lower the on-voltage.

Further, in a case where the width W4 of the connection recess 55a is formed to be wider than an interval W5 between the recesses 55, the holes are relatively likely to be accumulated just below the connection recess 55a and in the drift region 20 in the vicinity thereof. As a result, it is possible to generate the distinctive conductivity modulation of the IGBT, thereby lowering the on-voltage.

In the above illustrative embodiment, the structure where the connection recesses 55a are connected to the recesses 55 has been described. However, even when the connection recesses 55a are connected to only the outer recesses 55b without being connected to the recesses 55 and the connection recesses 55a and outer recesses 55b connected to each other are configured to surround the plurality of recesses 55 with being separated from the recesses 55, the same effects as the above illustrative embodiment are accomplished. Also, the connection recesses may be formed to surround the plurality of recesses 55 with being separated from the recesses 55 at a state where the connection recesses 55a and the outer recesses 55b are not connected to each other.

(Second Illustrative Embodiment)

Figure 22:
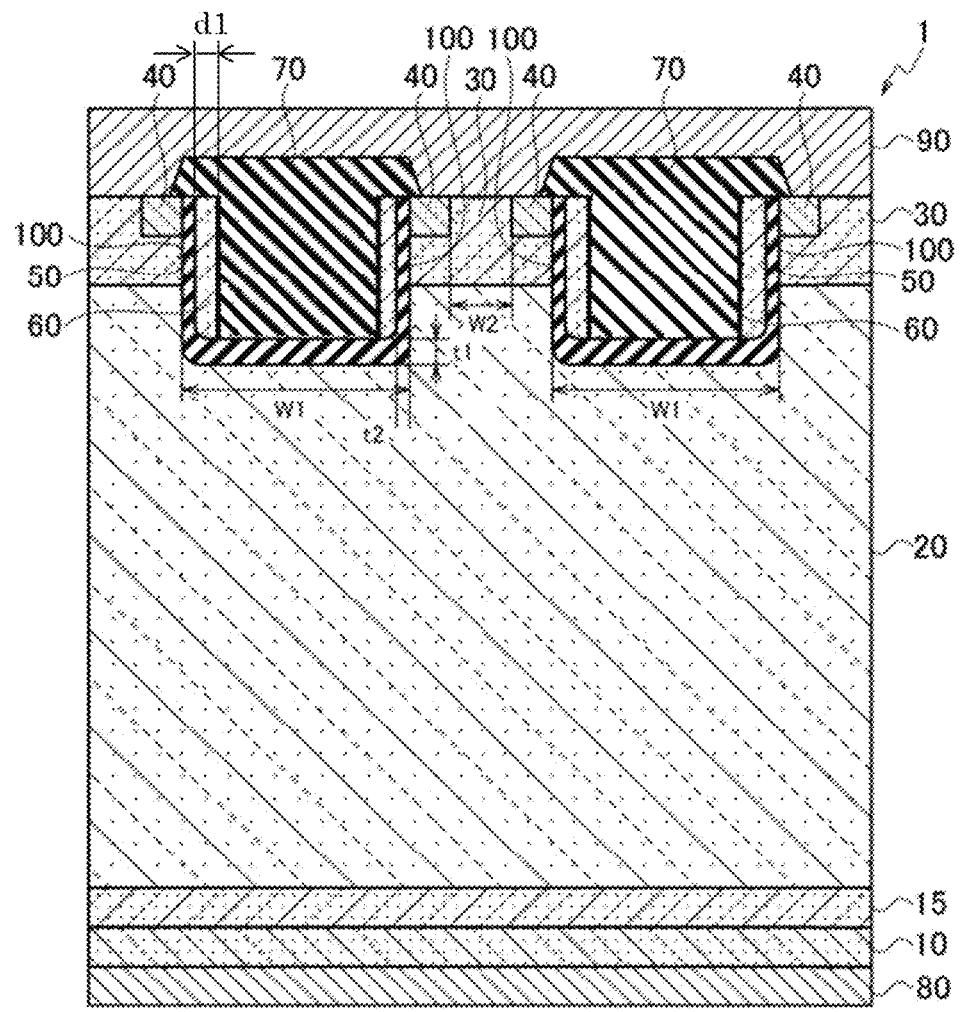
FIG. 22 is a schematic sectional view illustrating a structure of a semiconductor device according to a second illustrative embodiment of the present invention.

FIG. 22 is a schematic sectional view illustrating a semiconductor device according to a second illustrative embodiment of the present invention. The semiconductor device according to the second illustrative embodiment of the present invention has a structure of the gate electrode different from the semiconductor device according to the first illustrative embodiment, as follows.

The gate electrode 60 has left and right gate electrodes 60 (a first gate electrode and a second gate electrode) arranged on a pair of side surfaces (a first side surface and a second side surface) configuring the recess 55. The gate electrodes 60 are provided to face the base region 30 the insulation film 50 being interposed therebetween. Meanwhile, in the sectional view of FIG. 22, the left and right gate electrodes 60 are separated. However, the left and right gate electrodes 60 (a first gate electrode and a second gate electrode) extend in the extension direction of the recess 55 and reach the connection recesses 55a. At the connection recesses 55a, the left and right gate electrodes are connected to a bus line (not shown). The gate electrodes 60 consist of a polycrystalline silicon film, which is heavily doped to be conductive.

Also, the gate electrode 60 is not formed at a central side of the bottom surface of the recess 55. That is, although the gate electrodes 60 arranged along the side surfaces of the recess 55 are formed from the surface of the semiconductor substrate towards the bottom surface of the recess 55, the central side of the bottom surface of the recess 55 is not formed with the gate electrode 60.

Thereby, the parasitic capacitance Cdg between the drift region 20 below the bottom part of the recess 55 and the gate electrode 60 is reduced, so that a switching operation can be performed at high speed.

It is necessary for the gate electrode 60 to extend to the bottom surface of the recess 55 so as to form a channel. By doing so, the parasitic capacitance Cdg occurs between the gate electrode 60 and the drift region 20. In order to reduce the parasitic capacitance Cdg, it is necessary to thin the thickness of the gate electrode or to thicken the insulation film 50 on the bottom part of the recess 55.

Meanwhile, in order to easily accumulate the holes at the bottom part of the recess 55, it is more preferable that the gate electrode 60 reaches the bottom surface of the recess 55.

Therefore, a thickness dl of the gate electrode 60 to the width W1 of the recess 55 is about 1/20 to 1/3, further preferably, about 1/15 to 1/5. In a case where the thickness dl of the gate electrode 60 to the width W1 of the recess 55 is smaller than 1/20, the thickness of the gate electrode 60 is excessively thinned, so that a resistance value of the gate electrode 60 is increased and a switching response is thus deteriorated. To the contrary, in a case where the thickness dl of the gate electrode 60 to the width W1 of the recess 55 is beyond 1/3, it is not possible to sufficiently accomplish the effect of reducing the parasitic capacitance Cdg, which results from the separation of the gate electrode 60.

Also, as shown in FIG. 22, it is preferable that the insulation film 50 is formed so that the thickness t1 of the region thereof arranged on the bottom surface of the recess 55 is thicker than the thickness t2 of the region, which is arranged on the side surfaces of the recess 55 and facing the base region 30. Thereby, the withstanding voltage between the collector and the emitter is stably increased to improve the reliability.

Similarly to the recess 55, the insulation film 50 is arranged on the inner wall surface of the connection recess 55a, and an extension part from the gate electrodes 60 is arranged on the insulation film 50. Therefore, it is possible to form the connection recess 55a at the same time in the process of forming the recess 55.

In the meantime, the width of the connection recess 55a may be narrower than the width W1 of the recess 55. By narrowing the width of the connection recess 55a, the accumulation of the holes in a bottom surface of the connection recess 55a and in the vicinity of the bottom surface is reduced, as compared to the bottom surface of the recess 55. Thereby, it is possible to suppress a latch-up phenomenon due to the holes remaining in the outer periphery region of the semiconductor device 1. Since the emitter region 40 is not arranged at the periphery of the opening of the connection recess 55a, a channel is not formed.

(Modified Embodiments)

Meanwhile, since the width W1 of the recess 55 is wide in the semiconductor device 1, a part or all of the lower part of the interlayer insulation film 70 can be easily embedded in the recess formed in the upper surface of the emitter region 40. Therefore, it is preferable that at least a part of the interlayer insulation film 70 is embedded in the recess in which the gate electrode 60 is formed. Thereby, the upper surface of the emitter electrode 90 can be suppressed from protruding upwards in a region above the gate electrode 60 and can be thus more flattened, as compared to the background art. As a result, it is possible to solve a defect occurring in a process of bonding a wire on the emitter electrode 90, and the like.

Figure 17:
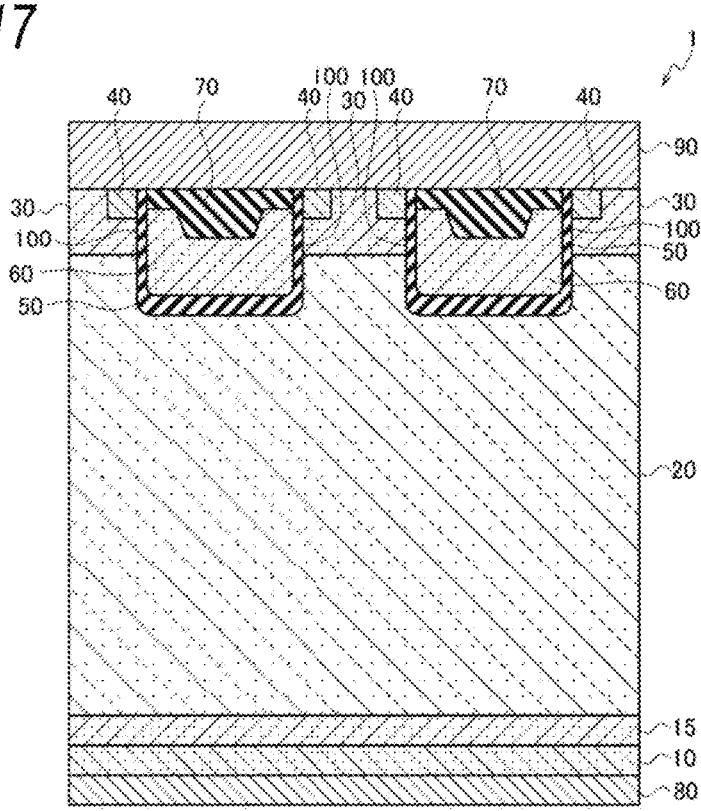
FIG. 17 is a schematic sectional view illustrating a structure of a semiconductor device according to a modified embodiment of the first illustrative embodiment of the present invention.
Figure 18:
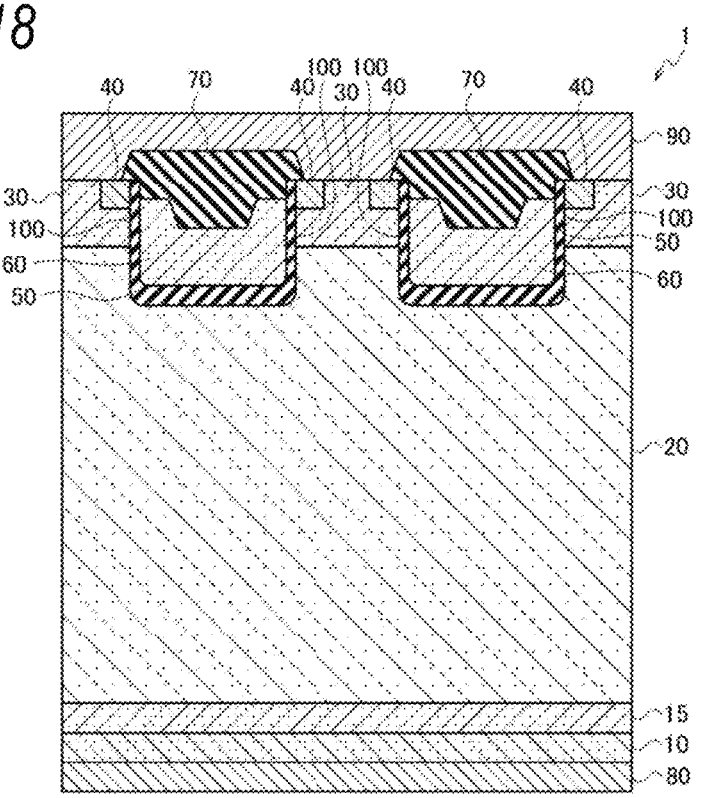
FIG. 18 is a schematic sectional view illustrating a structure of a semiconductor device according to another modified embodiment of the first illustrative embodiment of the present invention.

FIG. 17 illustrates an example where the entire interlayer insulation film 70 is arranged in the recess. In the semiconductor device 1 shown in FIG. 17, a position of the upper surface of the interlayer insulation film 70 is flush with a position of the upper surface of the emitter region 40. Meanwhile, the position of the upper surface of the interlayer insulation film 70 may be lower than the position of the upper surface of the emitter region 40. Alternatively, as shown in FIG. 18, a half or more of the thickness of the lower part of the interlayer insulation film 70 may be arranged in the recess.

(Other Illustrative Embodiments)

Although the illustrative embodiments have been described, it should be understood that the descriptions and drawings configuring the parts of the disclosure of the illustrative embodiments do not limit the present invention. From the disclosure, a variety of alternative illustrative embodiments, operating technologies and the like are obvious to one skilled in the art.

Figure 19:
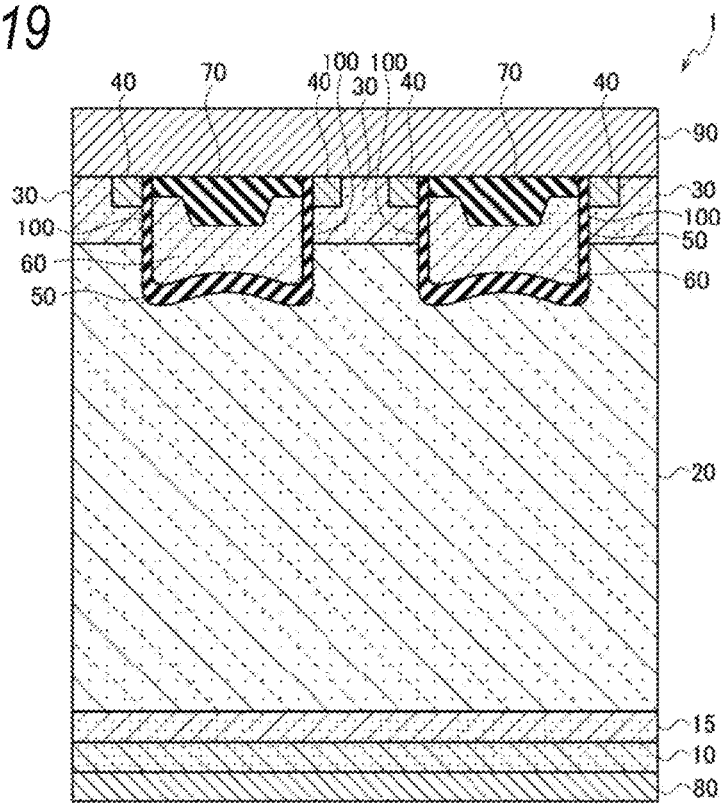
FIG. 19 is a schematic sectional view illustrating a structure of a semiconductor device according to another illustrative embodiment of the present invention.

For example, the bottom part of the recess may be formed to be thinner at the central part than at the end portions, as shown in FIG. 19. In a case where the bottom part of the recess is formed in this way, it is possible to accumulate the holes at the central part of the bottom part of the recess, more efficiently. As a result, it is possible to lower the on-voltage.

Figure 20:
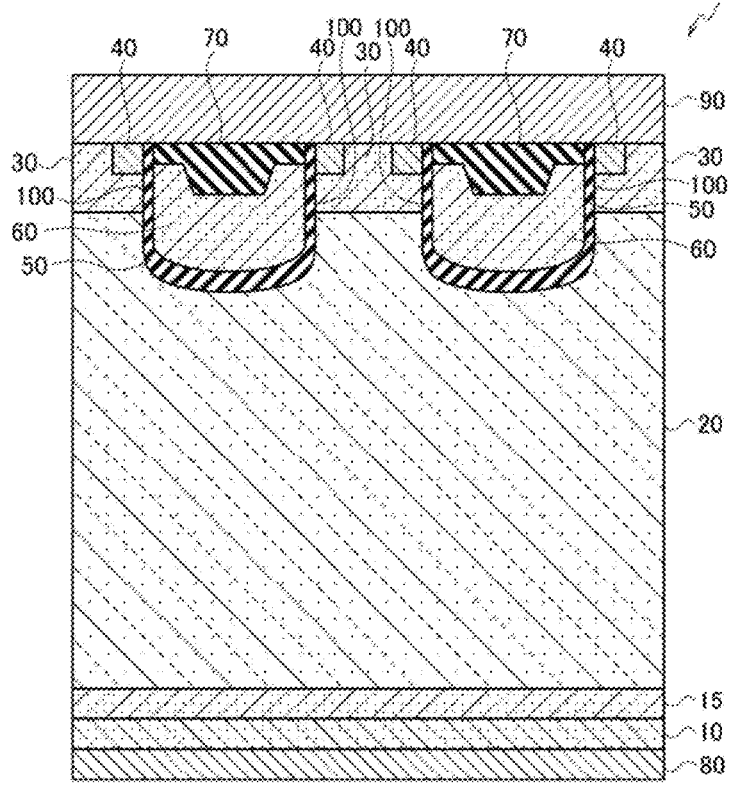
FIG. 20 is a schematic sectional view illustrating a structure of a semiconductor device according to another illustrative embodiment of the present invention.

Alternatively, as shown in FIG. 20, the recess may be formed to be round so that at least a part of the bottom part of the recess is convex downwardly. In a case where the roundness is large at the end portions of the bottom part of the recess, the holes are likely to move to the base region 30 without being accumulated below the recess. As a result, in a case where the bottom part of the recess is flat or the upwardly convex part thereof is wide, it is possible to lower the on-voltage.

The semiconductor device of the present invention can be used as a trench gate-type semiconductor device configured to perform a switching operation.

The invention claimed is:

1. A semiconductor device comprising:
   a first semiconductor region, which has a first conductivity type;

a second semiconductor region, which has a second conductivity type and is arranged on the first semiconductor region;
a third semiconductor region, which has the first conductivity type and is arranged on the second semiconductor region;
a fourth semiconductor region, which has the second conductivity type and is arranged on the third semiconductor region;
an insulation film, which is arranged on an inner wall of a recess that extends from an upper surface of the fourth semiconductor region and reaches the second semiconductor region with penetrating the fourth semiconductor region and the third semiconductor region, wherein the recess is configured by a plurality of recesses arranged in parallel and connected to each other by a connection recess, the connection recess being formed to extend from an upper surface of the third semiconductor region and to reach the second semiconductor region with penetrating the third semiconductor region, and wherein a width of the connection recess is wider than an interval between the plurality of recesses;
a control electrode, which is arranged on the insulation film on a side surface of the recess and faces the third semiconductor region;
a first main electrode, which is electrically connected to the first semiconductor region; and
a second main electrode, which is electrically connected to the fourth semiconductor region,
wherein a ratio of a width of the recess to a width of the third semiconductor region contacting the second main electrode is 1 or larger.

2. A semiconductor device comprising:
a first semiconductor region, which has a first conductivity type;
a second semiconductor region, which has a second conductivity type and that is arranged on the first semiconductor region;
a third semiconductor region, which has the first conductivity type and that is arranged on the second semiconductor region;
a fourth semiconductor region, which has the second conductivity type and that is arranged on the third semiconductor region;
an insulation film, which is arranged on an inner wall of a recess that extends from an upper surface of the fourth semiconductor region and reaches the second semiconductor region with penetrating the fourth semiconductor region and the third semiconductor region;
a control electrode arranged on the insulation film on a side surface of the recess and facing the third semiconductor region;
a first main electrode electrically connected to the first semiconductor region; and
a second main electrode electrically connected to the fourth semiconductor region,
wherein a ratio of a total area of the recess on an extension of an interface between the second semiconductor region and the third semiconductor region to a total area of a region of the third semiconductor region contacting the second main electrode is 1 or larger.

3. The semiconductor device according to claim 1,
wherein the connection recess extends in an arrangement direction of the plurality of recesses, and is connected to an end portion of a recess arranged at an outermost side of the plurality of recesses.

4. The semiconductor device according to claim 1,
wherein the connection recess comprises a first connection recess connected to one end portion of the plurality of recesses and a second connection recess connected to another end portion of the plurality of recesses,
wherein the first connection recess and the second connection recess are respectively formed to extend from the upper surface of the third semiconductor region and to reach the second semiconductor region with penetrating the third semiconductor region, extend in an arrangement direction of the plurality of recesses and are connected to an end portion of a recess arranged at an outermost side of the plurality of recesses, and
wherein the plurality of recesses is arranged in a region in which the first connection recess and the second connection recess face each other, as viewed from a plan view.

5. The semiconductor device according to claim 1,
wherein a width of the connection recess is narrower than the width of the recess.

6. The semiconductor device according to claim 1,
wherein the control electrode comprises a first control electrode and a second control electrode provided on a first side surface of the recess and a second side surface facing the first side surface and arranged to face the third semiconductor region with interposing the insulation film,
wherein the recess extends in a stripe shape, as viewed from a plan view, and
wherein lengths of the first side surface and the second side surface in an extension direction of the recess are larger than a facing interval between the first side surface and the second side surface.

7. The semiconductor device according to claim 1,
wherein the control electrode comprises a first control electrode and a second control electrode provided on a first side surface of the recess and a second side surface facing the first side surface and arranged to face the third semiconductor region with the insulation film being interposed therebetween, and
wherein the first control electrode and the second control electrode extend in an extension direction of the recess and reach a connection recess.

8. The semiconductor device according to claim 1,
wherein the width of the recess is 3 μm to 15 μm, a depth of the recess is 2 μm to 10 μm, a thickness of the second semiconductor region is 40 μm to 140 μm, and a specific resistance of the second semiconductor region is 10 Ωcm to 150 Ωcm.

9. The semiconductor device according to claim 1,
wherein the width of the recess is larger than a depth of the recess and the width of the recess is 3 μm to 15 μm.

* * * * *